ELECTRONICALLY TUNABLE SOLID STATE OSCILLATOR

Filed Dec. 29, 1961

INVENTOR
W. M. SHARPLESS
BY Kenneth W. Mateer
ATTORNEY

United States Patent Office 3,141,141
Patented July 14, 1964

3,141,141
ELECTRONICALLY TUNABLE SOLID STATE OSCILLATOR

William M. Sharpless, Fair Haven, N.J., assignor to Bell Telephone Laboratories, Incorporated, New York, N.Y., a corporation of New York
Filed Dec. 29, 1961, Ser. No. 163,268
7 Claims. (Cl. 331—107)

This invention relates to solid state high frequency oscillators and to means for controlling the frequency of such oscillators.

Heretofore, it has been common practice to use vacuum tube klystron type devices in applications in the kilomegacycle frequency range requiring variable frequency energy sources. Typical of such applications are frequency modulation arrangements, pulse generation techniques, and various switching arrangements. These klystron devices, while particularly suited for certain applications, are undesirably bulky and heavy for other applications such as air-borne space craft guidance systems and the like. Additionally, the power requirements of such klystron oscillators is unduly high for some applications.

During the past few years developments in the solid state diode field have proceeded rapidly. Among the recently developed diodes is a voltage controlled crystal iode exhibiting a region of negative resistance at frequencies in the kilomegacycle range, generally described as a tunnel diode. Such a diode depends on the quantum mechanical tunneling of charge carriers across a narrow rectifying barrier separating a pair of degenerate regions. The theory of such a diode is more fully explained in a report of Leo Esaki appearing in volume 109 of the Physical Review (1958) at page 603. In addition, crystal diodes exhibiting a variable reactance when subjected to a varying external voltage bias have been developed. These latter devices are known in the art as varactor diodes. The tunnel diode and the varactor diode are not only extremely compact and lightweight, but also are susceptibe to control by very small amounts of power.

Accordingly, it is an object of the present invention to produce controllable high frequency oscillations in a lightweight, compact microwave structure.

It is a further object of the invention to control, by means of a device having low power requirements, the frequency of oscillation of a negative resistance diode oscillator.

It is another object of the present invention to obtain wide band oscillator tuning with small control voltage excursions.

It is a more specific object of the invention to control the oscillation frequency of a negative resistance diode oscillator by controlling the bias voltage applied to an associated varactor diode.

A feature of the invention resides in a novel point contact diode construction which reduces the associated spring inductance.

An important advantage of the invention resides in the extremely small bias voltage excursions required to produce large oscillation frequency swings. Thus, for example, a one hundred megacycle linear frequency swing can be produced by a one half volt bias excursion.

In accordance with the invention, a voltage controlled negative resistance diode is positioned in a resonant environment and a varactor diode subject to an external voltage bias is positioned in electromagnetic coupling relationship thereto. In the particular resonant environment selected, the operating frequency range of the combination is determined by the relative transverse positions of the diodes, and the particular frequency of oscillation within such range is determined by the amplitude of the bias voltage applied to the varactor diode.

According to one preferred embodiment of the invention, a wave guide dimensioned to support the dominant mode at the frequencies of interest is backed by a transverse shorting plate of variable longitudinal position. Spaced away from the shorting plate approximately one quarter wavelength is a negative resistance diode positioned in a resonant aperture and immediately adjacent thereto in the longitudinal propagation direction is a varactor diode. The wave guide continues beyond the diodes and is available for connection into a transmission circuit.

The above and other objects and features, the nature of the present invention and its various advantages, may be more readily understood by reference to the accompanying drawing and the detailed description thereof which follows.

Figure 1:
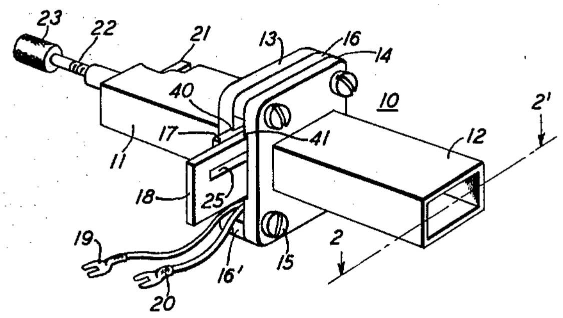
FIG. 1 is a perspective view of a wave guide oscillator in accordance with the invention.

Referring more particularly to FIG. 1, oscillator 10, operative in the 10 kilomegacycle frequency range, is illustrated comprising wave guide sections 11, 12 in joined relationship. Guides 11, 12 comprise a conductive metallic material such as copper and are rectangular in transverse cross section with the greater transverse dimension selected to be between one half and one wavelength at the lowest operating frequency and the lesser transverse dimension approximately one half the greater dimension. Thus the guides are of the dominant mode type. Guides 11, 12 are interconnected at flanges 13, 14 by means of fasteners 15, a separation between adjacent flanges being preserved by metallic spacers 16, 16′. Into the space between adjacent open ends of guide section 11, 12 are positioned slidable metallic diode holders or wafers 17, 18, wafer 18 containing an elongated slot 25 which can extend externally of flange 14 as illustrated. Shallow grooves 40, 41 are milled in the internal faces of flanges 13, 14. These grooves are dimensioned to be slightly larger than wafers 17, 18, thereby permitting adjustment of the relative transverse positions of the wafers while ensuring precise vertical alignment thereof. Each of wafers 17, 18 houses a crystal diode as will be explained in more detail hereinafter. Electrical leads 19, 20 are associated respectively with wafers 17, 18 and are accessible externally of the wave guide structure. Extending transversely across and forming a variably positionable metallic end wall for guide section 11 is movable plate 21, the longitudinal positioning of which is controlled by threaded member 22. Plate 21 is advanced toward wafers 17, 18 by a clockwise rotation of knob 23 and is withdrawn therefrom by a counterclockwise rotation. The internal constructional details of the oscillator of FIG. 1 may be more clearly understood from reference to FIG. 2, which is a plan view of the device of FIG. 1 taken at line 2—2′, and to FIGS. 3A and 3B.

Figure 2:
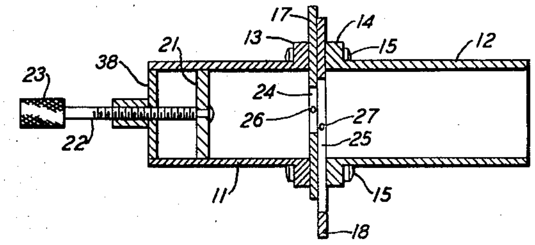
FIG. 2 is a plan view of the oscillator of FIG. 1.

In these figures, reference numerals have been carried over, where appropriate, from FIG. 1. Thus in FIG. 2, guide sections 11, 12 are joined at flanges 13, 14 by means of fasteners 15 and shorting plate 21, moved longitudinally with threaded member 22 by rotating knob 23, is spaced from wafers 17, 18 and forms the effective end wall of the wave guide cavity. Fixed conductive wall 38 provides engaging means for threaded member 22. Typically, shorting plate 21 is spaced one quarter wavelength at the operating frequency from wafer 17 but this distance can vary somewhat depending upon the electrical characteristics of the wafers when loaded with crystal diodes. In FIGS. 1 and 2, it should be noted that the quarter wavelength separation between plate 21 and wafer 17 is exaggerated with respect to the wave guide dimensions but this is for purpose of illustration only. Wafers 17, 18 are positioned side by side within grooves 40, 41 in the space between flanges 13, 14. For strength the wafers can be made of steel having a thickness of $\frac{3}{32}$ inch. In the kilomegacycle frequency range of interest, this $\frac{3}{32}$ inch dimension is less than one quarter wavelength. Thus energy cannot be supported as a transversely propagating wave, and no energy will escape from slot 25 regardless of its extent beyond flanges 13, 14. The wafers are advantageously gold plated to ensure good electrical contact between adjacent conductive members and thereby to reduce distortions caused by interruption of wall currents associated with propagating electromagnetic waves in the device. As illustrated, each of wafers 17, 18 has a rectangular aperture or slot disposed therein at a location below the top of the wafer at approximately one third of the vertical dimension thereof. A voltage controlled negative resistance diode 26 is disposed in slot 24 of wafer 17 and a varactor diode 27 is disposed in slot 25 of wafer 18. In this connection, it is not intended that the invention be limited to a rectangular aperture. Any of the many well known resonant slots, such as, for example, the "dumb bell" shape, can be used.

Figure 3A:
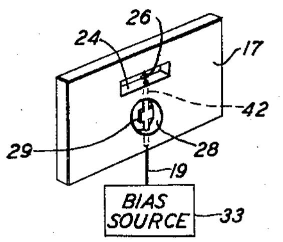
FIGS. 3A and 3B are perspective views of the diode holders shown in FIGS. 1 and 2.
Figure 3B:
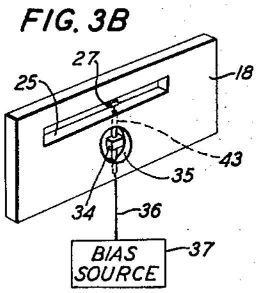

A more complete understanding of the constructional relationship between diodes 26, 27 and slots 24, 25 can be gained from reference to FIGS. 3A and 3B which are, respectively, perspective views of wafers 17, 18. As shown in FIG. 3A, negative resistance diode 26 is mounted across the narrow dimension of slot 24, one diode terminal being connected to the conductive wafer 17, the other diode terminal being connected to lead 42. This narrow dimension is, typically, substantially less than one eighth wavelength at the operating frequency. In the 10 kilomegacycle region, for example, this dimension can be $\frac{1}{32}$ inch. The long dimension of slot 24 in a direction transverse to the propagation direction and parallel to the wide wall of the guiding path is determined by the desired frequency range of oscillation of diode 26. For oscillators employing point contact diodes of low contact area, slot 24 has a long dimension slightly greater than one half wavelength at a frequency approximately ten percent above the highest oscillation frequency desired. Diode 26 extends across the narrow dimension of slot 24 and loads the slot sufficiently to lower the highest operating frequency to a value approximately ten percent below the resonance frequency determined by the dimensions of the unloaded slot. When junction diodes are used, slot 24 will be dimensioned differently due to the heavier loading produced. Disposed within a recess 28 in wafer 17 is by-pass capacitor 29 the presence of which permits a direct current or low frequency input lead to be attached. The high frequency by-pass capacitor 29 is advantageously located as near as possible to the bottom of slot 24. Electrically, the tubular lead 42 between diode 26 and by-pass capacitor 29 is also part of the total by-pass capacitance. Other types of high capacitance tubular conductors in which the conductor itself provides the entire by-pass capacitance are also feasible. Recess 28 must be of sufficient depth to ensure that capacitor 29 does not extend beyond the wafer surface, thereby interfering with variable transverse positioning of the wafer 17 with respect to guide 11 and wafer 18.

Figure 4:
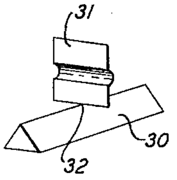
FIG. 4 illustrates a novel point contact diode arrangement.

Advantageously, diode 26 is a tunnel diode of the point contact type. In one operative embodiment of the present invention, diode 26 comprised, as illustrated in FIG. 4, a wedge 30 of p-type gallium arsenide doped with zinc with the contact point provided by a strip 31 of tin having a one half mil thickness. One edge of the tin strip 31, which is contoured to have a cylindrical portion between flat sheet portions, is disposed normal to the top edge of gallium arsenide wedge 30. Typically, the width of strip 31 is of the order of 50 times its thickness. A permanent point contact is effected by passing a current pulse through strip 31 and wedge 30. During this forming process, a minute but permanent n-type barrier region forms at the contact point. Such an n-type region is produced since tin is an n-type doping agent with respect to gallium arsenide. Materials other than tin, but having the n-type doping agent property could of course be substituted. This particular structure has been found to exhibit lower spring inductance than the ordinary small cross section wire, whisker type point contact diodes. Lead 19, extending from the lower portion of by-pass capacitor 29 is connected to bias source 33. In general source 33 is a low voltage level, low impedance source capable of applying a constant voltage to diode 26 of sufficient magnitude to place the operating point of the diode within the negative resistance portion of its voltage vs. current characteristic. Typically this involves establishing a forward bias of a fraction of a volt across the diode.

In FIG. 3B, wafer 18 is illustrated with varactor diode 27 positioned across slot 25, which has a narrow vertical dimension similar to that of slot 24 in wafer 17. One terminal of the varactor diode is connected to wafer 18 and the other terminal is connected to tubular lead 43. Diode 27 can be of the point contact or junction type. In one operative embodiment of the present invention, diode 27 comprised a phosphor bronze point in contact with a gallium arsenide base. Slot 25 is not intended to be resonant, and is simply made long enough to allow the position of the varactor diode to be moved from the center of the wave guide aperture to one side thereof without restricting the area of resonant slot 24 containing the negative resistance diode. As described above with respect to wafer 17, a by-pass capacitor 34 is disposed in recess 35 and is electrically connected between tubular lead 43 and bias lead 36. Capacitive leads may also be substituted as explained above with respect to capacitor 29. Bias source 37 provides a variable voltage to the varactor diode 27, and preferably has a tuning range sufficient to traverse the entire non-conducting reactive range of the varactor diode, ±5 volts being in general, sufficient.

In ordinary operation of the oscillator of FIG. 1, two concepts are involved. First, an oscillator per se is formed by wafer 17 and its associated negative resistance diode. Second, the introduction of wafer 18 and its associated variable reactance diode provides a simple means for tuning this oscillator electrically.

The initial procedure involved in tuning an oscillator in accordance with the invention comprises the steps which follow. Wafer 18 is moved transversely with respect to guides 11, 12 in a direction parallel to the broad guide walls until varactor diode 27 is out of electromagnetic coupling relationship with diode 26. Wafer 17 with negative resistance diode 26 positioned across slot 24 is then moved from a position in the vicinity of the narrow guide wall toward the center of the wave guiding path and a voltage is applied from bias source 33 of amplitude sufficient to place the operating point of the diode in the negative resistance region. The position of diode 26 within slot 24 determines in part the impedance presented by the loaded wafer. In some cases the diode is advantageously positioned closer to one narrow end wall of the slot than to the other. The longitudinal positioning of shorting plate 21 is then adjusted for a reactance match thus causing the resonant structure to emit strong oscillations. Electrically, slot 24 in wafer 17 is an iris which forms a parallel resonant circuit L, C, across wave guides 11–12, and diode 26, which shunts the slot, contributes additional capacitance $C_2$ as well as negative resistance $-\overline{G}$, the average value of which is determined by the amplitude of oscillation. In addition, the shorting wall 21 contributes a susceptance B to the tuned circuit. The load admittance $Y_0$ completes the lumped parameter analogy. Oscillations occur when $$-\overline{G}+Y_0+j\left[B-\frac{1}{\omega L}+\omega C\right]=0.$$

Further in accordance with the invention, and for the purpose of tuning the frequency of oscillation of negative resistance diode 26 and its associated structure, wafer 18 is moved inward toward the center of guide until the electromagnetic coupling between the varactor diode 27 and the negative resistance diode 26 is sufficient to effect a change in the electrical behavior of the resonant structure. Typically, the oscillation frequency can be varied over a one thousand megacycle range by a lateral movement of diode 27 less than one quarter wavelength in the 10 kilomegacycle region. Electrically, the introduction of the varactor diode introduces additional shunt reactance into the lumped parameter analogy set out above. The position of the varactor diode with respect to the negative resistance diode determines the frequency range over which tuning may be realized while the magnitude of the voltage bias applied to the varactor diode determines the particular frequency within said range at which oscillations occur.

Figure 5:
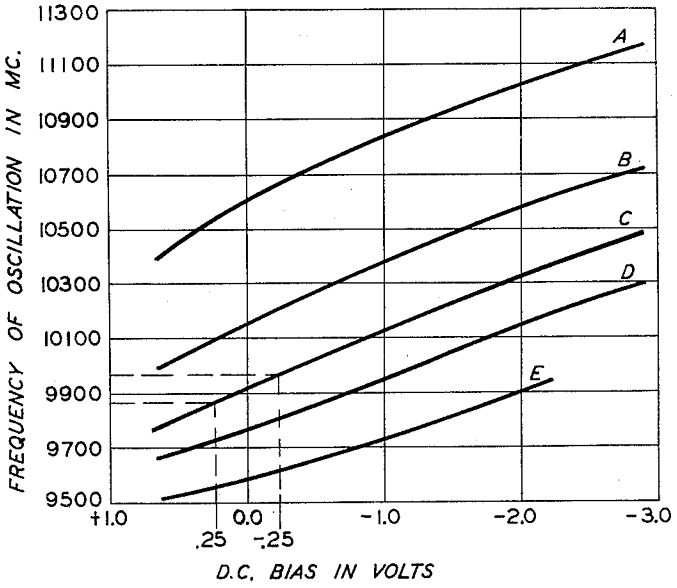
FIG. 5 is a graphical representation of the performance characteristic of the oscillator of FIG. 1.

A further understanding of the operation of an oscillator in accordance with the invention may be gained from reference to FIG. 5 which is a graphical representation of the electrical performance of a 10 kilomegacycle region varactor diode tuned negative resistance diode oscillator in accordnace with the invention. The data appearing in FIG. 5 were obtained with a zinc doped p-type gallium arsenide point contact negative resistance diode and a tellurium doped n-type gallium arsenide point contact varactor diode disposed across $\frac{1}{32}$ inch slots in gold plated $\frac{3}{32}$ inch thick steel wafers including 1000 mmf. by-pass capacitors. A +0.30 volt bias voltage was applied to the negative resistance diode, and the shorting plate was spaced approximately one quarter wavelength measured at midband from the wafer containing the negative resistance diode. As illustrated in FIG. 5, five curves designated A, B, C, D, and E appear as functions of the D.C. bias voltage applied to the varactor diode vs. the frequency of oscillation of the negative resistance diode structure. Each of curves A–E represents a different relative positioning of the varactor diode with respect to the edge of the slot containing the negative resistance diode. In the key to the various positions which follows, "in" indicates a varactor diode position closer to the negative resistance diode and "out" indicates a position further removed from the negative resistance diode Curve A—"in" $\frac{1}{16}$ inch
Curve B—"in" $\frac{1}{32}$ inch
Curve C—flush with edge
Curve D—"out" $\frac{1}{32}$ inch
Curve E—"out" $\frac{1}{16}$ inch From FIG. 5 it will be noted that, as the negative bias voltage applied to the varactor diode is increased, the frequency of oscillation of the negative resistance diode, in general, likewise increases. Furthermore, the amount of change in oscillation frequency per unit change in varactor bias increases slightly as the varactor diode is moved physically closer to the oscillating diode. This latter effect is explained as the result of increased physical coupling. The average frequency of oscillation also increases with the movement of the varactor diode closer to the oscillating diode, and this effect appears to be a function of the series resonance frequency of the varactor diode employed. The particular varactor diode used in obtaining the curves of FIG. 5 had a series resonance below the operating frequency, thus causing the diode to appear as a shunt inductance over the frequency range between 9 and 11 kilomegacycles. Therefore, the magnitude of the total inductance seen by the oscillating diode decreases as the physical coupling increases, thereby increasing the oscillation frequency. The frequency swings depicted in FIG. 5 represent a change in varactor bias which does not exceed the non-conducting range. From an examination of curve C for example, it can be seen that a very small change in bias from +0.25 volt to −0.25 volt produces a large linear frequency change of approximately 100 megacycles. By varying the varactor bias over its full non-conducting range, i.e., from +0.5 volt to −2.8 volts, a nearly linear shift of 700 megacycles is produced.

While the invention has been disclosed in a rectangular hollow pipe wave guide environment, no limitation to such a physical structure is intended. Thus, round hollow pipe wave guides as well as coaxial and strip transmission lines can be used. When practicing the invention in any one of these structures, it is necessary only that a tunnel diode-loaded resonant iris form a portion of a resonant transmission line cavity, and that a voltage controlled varactor diode be positioned in electromagnetic energy coupling relationship to the tunnel diode, whereby the change in reactance in the varactor diode in response to a change in the bias applied to the varactor diode is effective to vary the resonant frequency of the loaded iris and therefore the frequency of the oscillations. Further in this connection, although the described embodiment utilized crystal diodes of the point contact type, the invention is by no means limited to their use. Combinations of point contact and junction diodes or combinations of junction diodes alone are equally advantageous. In general, junction diode structure will operate at lower frequencies than point contact diode structures. Furthermore the diodes are not limited to a gallium arsenide composition. Diodes comprising other semiconductor materials such as selenium and germanium and exhibiting the necessary high frequency negative resistance characteristic of diode 26 and the variable reactance characteristic of diode 27 can be used.

A tunable oscillator as described hereinabove has wide potential application in the communication art. Thus, for example, a frequency modulated signal can be generated with low power requirements by varying the varactor voltage bias. One specific freqnency modulation arrangement, involving simple voice modulation, utilizes the fm signal produced produced by applying the signal generated in a telephone handset transmitter to the bias circuit of the varactor diode of a diode oscillator as described. Pulse generation applications are likewise numerous. By sweeping the frequency of a diode oscillator and applying the swept output to a fiter or tuned circuit, pulses of various shapes can be generated. The high speed with which such an oscillator can be swept permits pulse shape control as a function of sweep frequency. Furthermore, the low sweep voltage requirements permit the elimination of long bias leads and the spurious resonance problems associated therewith.

In all cases it is understood that the above described arrangements are merely illustrative of some of the specific embodiments which can represent an application of the principles of the present invention. Numerous and varied other arrangements can be devised in accordance with these principles by those skilled in the art without departing from the spirit and scope of the invention.

What is claimed is:

1. A variable frequency solid state oscillator comprising:

a section of conductively bounded wave guide adapted to support wave energy with a given frequency range of operation, a crystal diode exhibiting negative resistance under the influence of a voltage within a given range of values, means for applying said voltage to said diode, said diode being mounted within said guide section in an aperture which together with said diode is resonant at the highest frequency within said range, said guide section being conductively bounded at one end thereof, a varactor diode positioned in energy coupling relationship with said negative resistance diode, and means for applying a variable biasing voltage to said varactor diode whereby the frequency of oscillation of said negative resistance diode is controlled.

2. In combination, a section of conductively bounded wave guide, a conductive shorting member positioned across one end of said section, means for generating electrical oscillations positioned transversely across said guide in a plane parallel to and spaced away from said shorting member, said means including a negative resistance diode in a resonant environment, and means for controlling the frequency of said electrical oscillations, said last recited means including a varactor diode positioned in direct energy coupling relationship with said negative resistance diode.

3. A solid state source of electrical oscillations comprising:

a section of conductively bounded wave guide adapted to support dominant mode wave energy in the kilomegacycle frequency region, said guide section being conductively bounded at one end thereof, a conductive wafer extending across said guide section at the other end thereof, said wafer having an aperture therein resonant slightly above the highest contemplated frequency of operation within said range, a crystal diode exhibiting negative resistance in said frequency region under the influence of an applied bias voltage, said diode being mounted within said aperture and comprising a triangular wedge of p-type material with a flat conductive strip of material exhibiting n-type doping properties with respect to said p-type material positioned normal to one edge of said triangular wedge, and means for applying said bias voltage to said diode.

4. The arrangement of claim 3 in which said p-type material comprises gallium arsenide and said strip comprises tin.

5. In combination with the arrangement of claim 3, means for changing the frequency of oscillation of said source, said frequency changing means comprising the combination of a varactor diode positioned in a non-resonant aperture in a second conductive wafer positioned adjacent said first wafer, and means for applying a bias voltage of controllable amplitude to said varactor diode, said amplitude being limited to the non-conducting range of operation of said varactor diode.

6. A variable frequency solid state oscillator operative in the 10 kilomegacycle frequency range comprising a section of conductively bounded wave guide adapted to support wave energy within said frequency range, a crystal diode exhibiting negative resistance under the influence of a voltage within a given range of values, means for applying said voltage to said diode, said diode being mounted within said guide section in a resonant aperture having one transverse dimension of the order of one half wavelength at the operating frequency, the other dimensions of said aperture being less than one eighth wavelength at said frequency, said guide section being conductively bounded at one end thereof, a varactor diode positioned in energy coupling relationship with said negative resistance diode, and means for applying a variable biasing voltage to said varactor diode whereby the frequency of oscillation of said negative resistance diode is controlled.

7. A source of electrical oscillations comprising in combination, a resonant section of electromagnetic wave energy transmission line adapted to support dominant mode wave energy in the kilomegacycle region, a first conductive wafer having an aperture therein loaded with a tunnel diode, said wafer forming a portion of said section, means for applying a bias voltage to said diode, and means for changing the frequency of oscillation of said source said frequency changing means comprising a varactor diode positioned in a non-resonant aperture in a second conductive wafer positioned adjacent said first wafer, and means for applying a bias voltage of controllable amplitude to said varactor diode, said amplitude being limited to the non-conducting range of operation of said varactor diode.

References Cited in the file of this patent

UNITED STATES PATENTS 3,039,064 Dain et al. ------------- June 12, 1962

OTHER REFERENCES

Article by Hines in Bell System Tech. Journal, pages 477–513, May 1960.